United States Patent [19]
Groth et al.

[11] 3,809,965

[45] May 7, 1974

[54] SOLID STATE RELAY AND TIMER HOUSING MEANS

[75] Inventors: Clarence N. Groth, Mequon; James N. Hempel, Milwaukee; Robert A. Wieczorek, Glendale; Charles F. Meyer, Wauwatosa; Robert G. Cook, Cedarburg, all of Wis.

[73] Assignee: Square D Company, Park Ridge, Ill.

[22] Filed: Mar. 26, 1973

[21] Appl. No.: 345,162

[52] U.S. Cl. .............. 317/113, 317/101 R, 335/152

[51] Int. Cl. .............................................. H02b 1/04

[58] Field of Search ................. 335/152; 200/168 R; 317/99, 101 R, 101 CC, 112, 113, 118, 120

[56] References Cited

UNITED STATES PATENTS

| | | | |
|---|---|---|---|
| 3,508,180 | 4/1970 | Mayl | 335/152 |
| 3,445,728 | 5/1969 | Jorgensen | 317/113 |
| 3,562,595 | 2/1971 | Swanson | 317/113 |
| 3,593,231 | 7/1971 | Van Horn | 317/101 R |

*Primary Examiner*—Robert K. Schaefer
*Assistant Examiner*—Gerald P. Tolin
*Attorney, Agent, or Firm*—William H. Schmeling; Harold J. Rathbun

[57] ABSTRACT

A solid state relay structure capable of replacing an electromagnetically operated relay. The relay includes a basic support on which up to four switching modules may be easily mounted. The basic support provides a housing for a printed circuit board which has circuits arranged to cause two of the switching modules to provide an instantaneous type switching contact operation and two of the modules to provide an OFF delay or ON delay type of switching contact operation. The basic support has a readily accessible adjustment knob which will permit the timing interval of the relay to be easily changed. Isolation between the solid state control circuit and the power switching circuits in the four modules is provided by reed switches in the switching modules and four magnet coil windings that are carried by the basic support structure.

11 Claims, 10 Drawing Figures

SOLID STATE RELAY AND TIMER HOUSING MEANS

The present invention relates to electric control devices and is more particularly concerned with the structural details of a solid state relay.

The advantages of solid state relays and timers over electromagnetically operated relays and timers are well known and include the ability of the solid state devices to operate reliably at higher switching speeds in normal as well as hostile environments with a life expectancy many times that of conventional relays. In spite of the advantages, the use of solid state relays and timers in industrial applications is limited due mainly to the high cost of the devices, the difficulties encountered when the device is wired on a panel and the switching operation is required to be changed. The solid state relay and timer structure according to the present invention overcomes the objectionable features of solid state relays heretofore known.

It is an object of the present invention to provide a low cost, reliable, compact solid state relay and timer with a structure which will permit the relay to be used in place of an electromechanical relay.

Another object is to provide a solid state relay and timer structure which will permit the switching mode of the device to be easily changed.

A further object is to provide a solid state relay and timer structure which will permit its mode of operation to be easily modified and its timing interval to be easily changed.

An additional object is to provide a solid state relay or timing structure which will permit the device to have a selected number of switching modules with each of the switching modules having its own heat sink.

Further objects and features of the invention will be readily apparent to those skilled in the art from the following specification and from the appended drawings illustrating certain preferred embodiments, in which.

Figure 1:
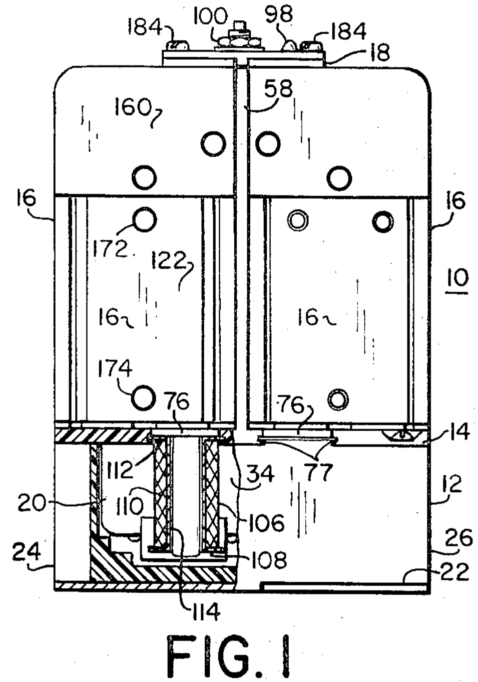
FIG. 1 is a side elevation of a solid state device according to the present invention with a portion of the base broken away to illustrate a magnet coil winding as used in the relay.
Figure 8:
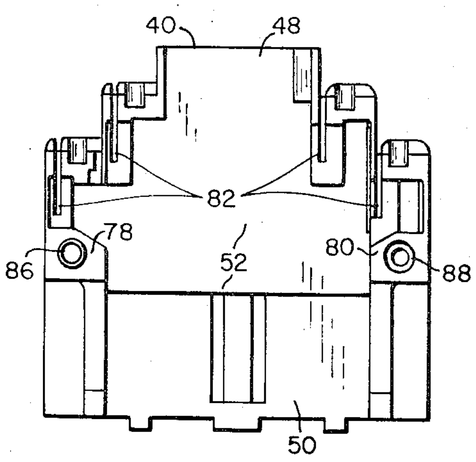
Figure 9:
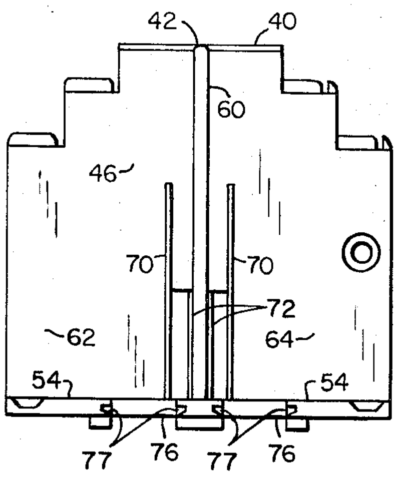
Figure 10:
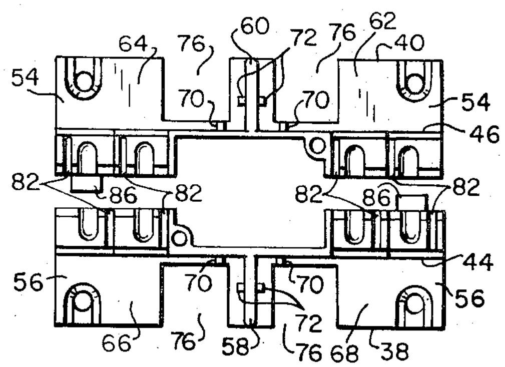

FIGS. 8 and 9 respectively show a cavity side and a module side of a support part as used in the relay in FIG. 1; and FIG. 10 is a top view of a pair of support parts showing the orientation of the parts before assembly.

A solid state relay 10, as shown in the drawings, includes a base 12, a support 14, a plurality of switching modules 16, a cover 18, and a printed circuit board 20. The base 12 is formed as a rectangular part of molded insulating material and includes a rectangularly shaped rear wall 22, a pair of parallel and spaced end walls 24 and 26, a pair of parallel and spaced side walls 28 and 30, an open front side 32 and a rectangularly shaped cavity 34 extending rearwardly from the front side 32 to the rear wall 22. The rear wall 22 is secured to a metal plate 36 which is provided so that the relay 10 may be mounted on a panel, not shown.

The support 14 is provided by two identical molded insulating support parts 38 and 40 which are positioned to engage opposite sides of the printed circuit board 20. The support parts 38 and 40 are secured on the front side 32 and position the printed circuit board 20 so that the printed circuit board 20 extends in the plane that is spaced equidistantly between the side walls 28 and 30 and perpendicular to the end wall 22. The support parts 38 and 40 have walls defining a housing 42 wherein the printed circuit board 20 is received with the housing 42 having side walls 44 and 46 extending in planes parallel to the printed circuit board 20 and spaced intermediate the plane of the printed circuit board 20 and the adjacent front edges of the side walls 28 and 30 respectively. As illustrated by FIGS. 8–10, the housing 42 is provided with an opening 48 at its front end and an opening 50 at its rear end and a passageway 52 which extends between the openings 48 and 50. Portions of the printed circuit board 20 are received within the passageway 52 and extend through the opening 50 into the cavity 34. Extending outwardly from rear edges of the side walls 44 and 46 are foot-like flanges 54 and 56. The flanges 54 and 56 extend to cover the portions of the front side 32 that are not covered by portions of the housing 42. Extending outwardly from the side walls 44 and 46 are ribs 58 and 60, respectively. The ribs 58 and 60 extend in a plane that is perpendicular to the plane of the printed circuit board 20 and spaced equidistantly between the end walls 24 and 26. The ribs 58 and 60 extend from the respective side walls 44 and 46 to the side edges of the flanges 54 and 56 respectively and together with portions of the side walls 44 and 46 provide four sockets 62, 64, 66 and 68 with each socket having a pair of open sides located at one of the corners of the support 14 and extending perpendicular to the base 12 from the flanges 54 and 56. Each of the sockets 62, 64, 66 and 68 is provided with ribs 70 which are formed on portions of the side walls 44 and 46 and ribs 72 which project from the ribs 58 and 60. The ribs 70 and 72 extend perpendicular to the rear wall 22 for the purpose of maintaining the switching modules 16 on the support 14 in a manner which will be later described.

Located in the portions of the flanges 54 and 56 which provide the rear wall of each of the sockets 62, 64, 66 and 68 is the rectangular opening designated by a numeral 76. The rectangular opening 76 in each socket extends from the side edges of its associated flange 54 or 56 to the associated side wall 44 or 46 and is located to be adjacent the walls of its associated rib 58 or 60 which provides the respective sockets 62, 64, 66 and 68. The opposite walls of each of the openings 76 are provided with a V-shaped groove 77. Each groove 77 is arranged to receive a rectangular flange portion on a bobbin of a coil winding, as will be later described.

As most clearly seen in FIG. 8, the portions of the support parts 38 and 40 which engage the printed circuit board are provided by ribs 78 and 80. The ribs 78 and 80 define the passageway 52 and extend along the passageway 52 side of the side walls 44 and 46. The forward edges of the side walls 44 and 46 are stepped and the ribs 78 and 80 are provided with slots 82 which receive wire connecting terminals 84 that are carried on the printed circuit board 20. Movement of the terminals 84 is prevented by the slots 82 when the printed circuit board 20 is sandwiched between the support parts 38 and 40. As shown in FIG. 8, the rib 78 is provided with a cylindrical boss 86 and the rib 80 is provided with a cylindrical bore 88. The bosses 86 and the bores 88 on the respective parts 38 and 40 are arranged so that the boss 86 on the rib 78 is received in the bore 88 on the rib 80 when the parts 38 and 40 are positioned on opposite sides of the printed circuit board 20 with the bosses 86 extending through openings 90 in the printed circuit board 20 to maintain the printed circuit board 20 in its position within the passageway 52.

Figure 3:
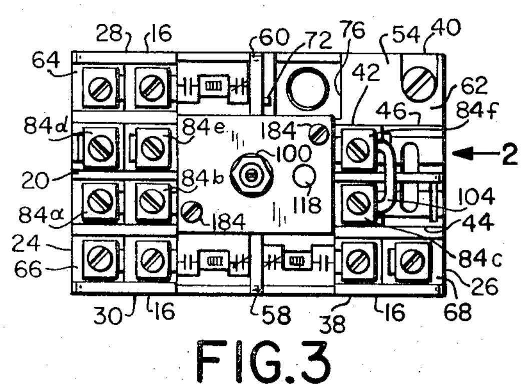
FIG. 3 is a top view of the relay in FIG. 1.
Figure 6:
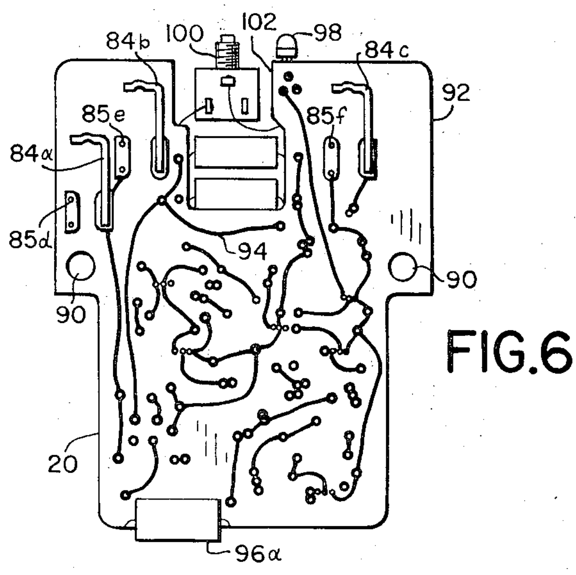
FIG. 6 is a view of one side of a printed circuit board as used in the relay in FIG. 1.

The circuits and components of the circuit which may be carried on the printed circuit board 20 are fully disclosed in an application for U.S. Pat., Ser. No. 345,163, filed Mar. 26, 1973, Docket No. IC-543, which is filed by the inventor Robert G. Cook concurrently herewith. The printed circuit board 20 includes a flat insulating substrate 92 with a printed circuit 94 formed on one side face of the substrate 92 and the components 96, i.e., resistors, capacitors, transistors and the like, positioned on the other side face of the substrate 92. The substrate 92 also positions the terminals 84 before the printed circuit board 20 is assembled with the support parts 38 and 40. Three of the terminals 84, respectively designated as 84*a*, *b* and *c*, are positioned to project from the side of the substrate 92 that carries the printed circuit 94 and three of the terminals 84, designated as 84*d*, *e* and *f*, not shown in FIG. 6 and illustrated in FIG. 3, are positioned to project from the side of the substrate 92 whereon the components 96 are mounted. The terminals 84*d*, *e* and *f* are connected to portions 85*d*, *e* and *f*, respectively, on the side of substrate 92 that carries the printed circuit 94. The terminals 84*a*, *b* and *c* are connected to portions, not shown, that are similar to the portions 85*d*, *e* and *f* and carried on the side of the substrate 92 whereon the components 94 are positioned.

Figures 2, 4, 5:
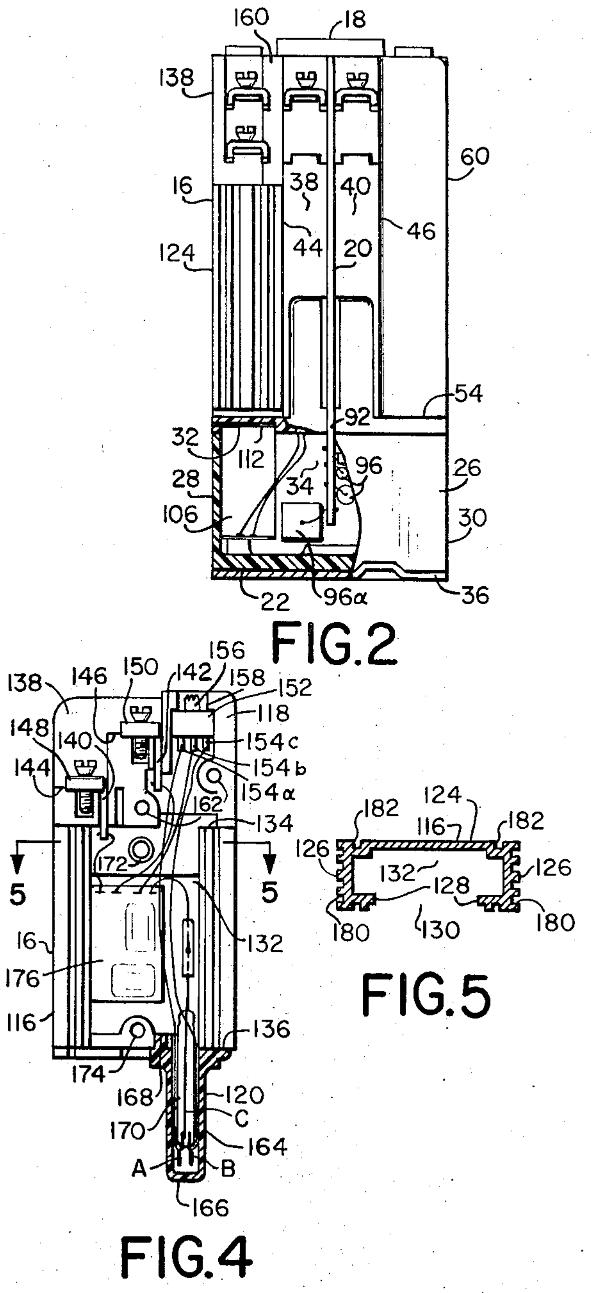
FIG. 2 is an end elevation of the relay in FIG. 1 with a portion of the base broken away to illustrate a portion of a printed circuit board and a resistor as used in the relay.
FIG. 4 is a side view of a switching module for the relay in FIG. 1 with a cover for the module removed.
FIG. 5 is a cross-sectional view of a portion of the housing for the module in FIG. 4 taken along line 5—5 in FIG. 4.

A light emitting diode 98 is positioned at the front edge of the substrate 92 and connected in the printed circuit as described in the Cook application, supra. A rheostat-type potentiometer 100 is positioned by the cover 18 to be received in a notch 102 in the substrate 92 and is connected in the circuit carried by the substrate 92 as described in the Cook application, supra. Also, if desired, a selected one of the components 96, e.g., a load resistor 96*a*, which will generate heat when the circuit on the substrate 92 is energized, may be positioned by the substrate 92 so the resistor 96 is adjacent the rear wall 22, as shown in FIG. 2, so the base 12 and plate 36 may aid in dissipating heat generated by the resistor 96*a*.

As shown in FIG. 3, the terminals 84*c* and 84*f* are interconnected by a jumper 104. The terminals 84*c* and 84*f* are connected to the circuit on the printed circuit board and are provided so that the potentiometer 100 may be mounted remotely from the device 10 and connected into the circuit through the terminals 84*c* and *f* when the jumper 104 is removed. As disclosed in the Cook application supra, the circuit carried on the printed circuit board 20 has four input terminals, two of which are required to be continuously energized and two of which are energized when an outside switching means is actuated. While any of the terminals 84*a*, *b* and *e* may be connected to provide the proper inputs to the circuit on the printed circuit board 20, in the embodiment shown, the terminals 84*a* and *b* are required to be continuously energized from an alternating current source and the terminals 84*d* and *e* are connected to a switching means which provides an input to the circuit on the printed circuit board when the switching means is actuated. As disclosed in the Cook application supra, the circuit on the printed circuit board 20 is arranged to control the energization of four magnet coil windings. The four coil windings are provided in the solid state device 10 by four magnet coil assemblies each designated by a numeral 106. Each magnet coil assembly includes a molded thermoplastic bobbin 108 having a magnet winding 110 wound thereon. The magnet coil assemblies 106 are positioned in the cavity 34 so that each magnet coil assembly 106 is positioned rearwardly of one of the four rectangular openings 76. Each of the bobbins 108 has a rectangular front end 112 which is sized so the edges of the end 112 is received in the slots 77 and the front end 112 of the bobbin 108 substantially closes the rectangular opening 76 wherein it is positioned by the slots 77. Each bobbin 108 has a cylindrical bore 114 extending rearwardly from the front end 112 which is surrounded by a winding 110. The windings 110 on the respective four magnet coil assemblies 106 are connected to the circuit disclosed in the Cook application so that two of the windings 110 are energized simultaneously with the energization of the terminals 84*b* and 84*e* and two of the windings 110 are energized a predetermined time interval after the terminals 84*b* and 84*e* are either energized or deenergized, selectively.

The solid state device 10 may be provided with one, two, three, or four identical switching modules 16, each of which may be positioned in any one of the four sockets 62–68 at the four corners of the base 12 by the cover 18. Each switching module 16, as shown in FIG. 4, includes a housing 116, a terminal and switch support 118, a reed switch support 120, and a cover 122. The cover 122 is not illustrated in FIG. 4. The housing 116 preferably is formed as an extruded metal part, such as aluminum, which has a high thermal conductivity. As viewed in FIGS. 4 and 5, the housing 116 has a back wall 124, a pair of side walls 126 extending along opposite marginal edges of the back wall and inwardly extending flanges 128 extending along the front marginal edges of the side walls 126 to provide an access opening 130 in the front side of the housing 116 to a cavity 132 within the housing 116. The housing 116 has an open top end 134 and an open bottom end 136.

The support 118 is formed of a molded insulating material and is positioned to close the open top end 134. The support 118 has a back wall 138 forming an extension of the back wall 124 and a pair of slots 140 and 142 extending between the cavity 132 and a pair of ledges 144 and 146, respectively, on the top end of the support 118. A pair of terminals 148 and 150 are respectively positioned in the slots 140 and 142 and have portions extending into the cavity 132 and portions positioned on the ledges 144 and 146, respectively. The ledges 144 and 146 are staggered from top to bottom on the support 118 so the portions of the terminals 148 and 150 positioned on the ledges 144 and 146 will be electrically spaced and readily accessible from the top end of the support 118. The front side of the support 118 is also provided with a recess which receives a selector switch 152. The switch 152 is of the double throw type and has its terminals 154*a*, *b* and *c* exposed to the cavity 132 and a slidable switching operator 156 exposed to the external top end of the support 118 by an opening 158. The front side of the support 118 is closed by a cover 160 which is secured to the support 118 by suitable rivets which pass through a pair of openings 162. The cover 160 maintaining the terminals 148 and 150 in slots 140 and 142 respectively and the switch 152 in its recess so the operator 156 is accessible through the opening 158 from the top side of the module 16. The support 120 is formed of a molded insulating material and is positioned to enclose the bottom end 136. Extending downwardly from the support 120 is a cylindrical projection 164 which is tubular in shape and has a closed bottom end 166 and an open top end 168 exposed to the cavity 132. In the embodiment shown, a form C reed switch 170 is positioned in the projection 164 with the longitudinal axis of the tubular shell of the reed switch 170 aligned with the longitudinal axis of the cylindrical projection 164.

As shown, the form C reed switch 170 has a pair of spaced stationary contacts A and B and a resilient finger having a portion C which acts as a movable contact positioned between the stationary contacts A and B. The resilient finger of the switch 170 is stressed so that the movable contact C normally engages the contact A. When the reed switch 170 is subjected to a magnetic flux, the movable contact C will move out of engagement with the contact A and into engagement with the contact B.

The opening 130 is closed by the cover 122. The cover 122 is secured to the front side of the housing 116 by projections 172 and 174 which respectively extend from the front side of the supports 118 and 120 through openings in the cover 122. The projections 172 and 174 are hot upset to maintain the cover 122 in its position on the housing 116.

Figure 7:
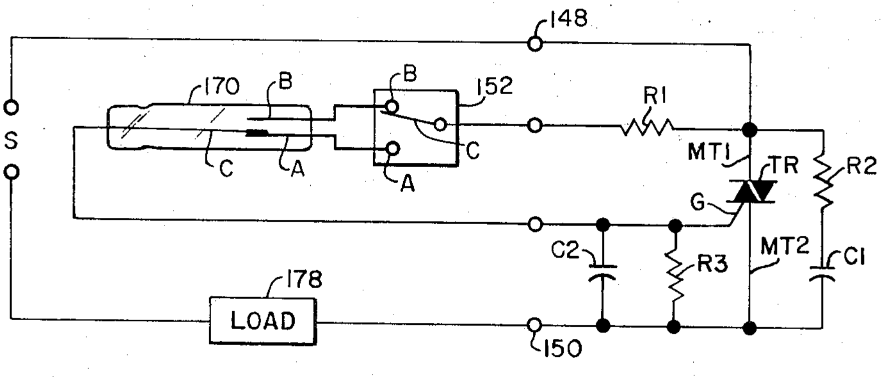
FIG. 7 is a schematic view of a circuit as used in the module in FIG. 4.

The terminals 148 and 150, the terminals of the switch 152, and the terminals of the reed switch 170, are connected to the components of a solid circuit, as shown in FIG. 7. The components of the circuit as shown in FIG. 7 are included in an encapsulated module 176 which is mounted in heat conducting relation on the back wall 124 of the metal support housing 116. The circuit includes a triac TR, resistors R1, R2 and R3, and capacitors C1 and C2.

The term "triac" is an acronym that has been coined to identify the triode (three-electrode) A.C. semiconductor switch which is triggered into conduction by a gate signal in a manner similar to the action of a silicon controlled rectifier. The triac, generically called a bidirectional triode thyristor, first developed by General Electric (U.S. Pat. No. 3,275,909 and others applied for), differs from the silicon controlled rectifier in that it can conduct in both directions of current flow in response to a positive or negative gate signal.

The triac TR has a main terminal MT1 connected to the terminal 148 and a main terminal MT2 connected to the terminal 150. The resistor R1, which acts as a load resistor in the gate circuit of the triac TR, is connected between the terminal 148 and the movable contacts C of the switch 152. The gate G of the triac TR is connected to the movable contact C of the reed switch 170. The stationary contacts B of the reed switch 170 and the switch 152 are interconnected and the stationary contacts A of the reed switch 170 and the switch 152 are interconnected. The resistor R3 and the capacitor C2 are connected in parallel between the gate G and the main terminal MT2 to act as noise suppressors. The resistor R2 and the capacitor C1 are connected in series between the main terminals MT1 and MT2 to act as noise suppressors. When the device 10 is wired in a control circuit the terminal 150 is connected through a load 178 to one side of an alternating current source S that has the other side connected to the terminal 148 so that the load 178 will be energized when the triac TR is in the conductive state and deenergized when the triac TR is non-conducting. The conducting state of the triac TR is controlled by the contacts of the switch 170 and the switch 152.

A switch module 16 is programmed to provide a normally open type of contact operation when the movable contact C of the switch 152 is positioned to engage the stationary contact B and a normally closed type of contact operation when the movable contact C of the switch 152 is positioned to engage the stationary contact A. When the movable contact C of the switch 152 engages contact B and the switch 170 is deenergized, the gate circuit to the triac TR is interrupted and the triac TR is non-conductive. The movable contact C will engage the contact B of the switch 170 when the switch 170 is energized by a magnetic flux output of a coil assembly 106 and complete the gate circuit to the triac TR through the engaging contacts A and C of the switch 152, and the engaging contacts B and C of the switch 170 which causes the triac TR to conduct. The conducting triac TR causes the load 178 to be energized from the source S through a circuit that includes the terminals 148 and 150 and the conducting triac TR.

When the movable contact of the switch 152 is positioned to engage the contact A and the switch 170 is de-energized, the gate circuit to the triac TR will be completed and the triac TR will be conductive and the load 178 will be energized. The movable contact C will engage the contact B of the switch 170 when the switch 170 is energized by a magnetic flux output of the coil assembly 106 and interrupt the gate circuit to the triac TR which causes the triac to be non-conductive and the load to be de-energized.

The heat dissipated in the triac TR during periods when the load 178 is energized is dissipated by the metal housing 116. The housing 116 is provided with suitable grooves 180 on its side walls 126 to aid in the dissipation of the heat. The back wall 124 of the housing 116 is provided with a pair of suitable grooves 182 which are sized and located to receive the ribs 70 on either of the support parts 38 or 40. One of the grooves 180 is arranged to receive the ribs 72 on the support parts 38 and 40. The grooves 180 and ribs 70, together with the grooves 182 and the ribs 72, are provided to maintain a module 16 in any one of the sockets 62–68. When a module 16 is positioned in one of the sockets 62–68, the projection 164 will be positioned in the bore 114 of the magnet coil assembly 106 located rearwardly of the sockets 62–68 so that when the magnet coil assembly 106 is energized, the reed switch 170 which is positioned within the bore 114 will be energized to control the operation of the triac TR. The cover 18 is secured to the top end of the housing 42 on the support parts 38 and 48 by a pair of screws 184 which are threaded into openings in the parts 38 and 40. The cover 18 is sized to engage portions at a corner of each of the switch modules 16 which are located in the sockets 62–68 to prevent the modules 16 from moving forwardly out of the sockets while the grooves 180 and 182, and their associated ribs 70 and 72, respectively, prevent the module from moving sideways out of the sockets.

The cover 18 is provided as a suitable opening so that the potentiometer 100 may be mounted on the cover 18 and a suitable opening 118 which is aligned with the light emitting diode 98 so that the light emitting diode will be visible from the front of the device 10 when the diode 98 is energized as described in the Cook application, supra.

As described, the solid state relay 10 is easy to wire as all of the terminals 84 on the support 14 and all of the terminals 148 and 150 on the modules 16 are exposed on the front end of the relay 10. The timing periods of the relay 10 may be easily adjusted as the adjustment knob of the potentiometer 100 is fully exposed at the front of the relay 10. The presence of the timing period may be easily ascertained because of the exposed light emitting diode 98 at the front of the relay 10. The number and type of switching functions of the relay 10 may be easily changed by varying the number of the four switching modules 16 at the corners of the support 14 after the cover 18 is removed and the type of contact operation can readily be changed from normally open to normally closed type of contact operation and vice versa by merely moving the switch operator 156 to the desired position.

While certain preferred embodiments of the invention have been specifically disclosed, it is understood that the invention is not limited thereto, as many variations will be readily apparent to those skilled in the art and the invention is to be given its broadest possible interpretation within the terms of the following claims.

What is claimed is:

1. A solid state relay comprising: a rectangular base having an open front end and a cavity extending rearwardly from the open front end, a support including: a rear wall at a rear end of the support providing a cover for the open front end of the base, a side wall and a rib extending forwardly from the rear wall providing a pair of mutually perpendicular adjacent side walls of an open sided rectangularly shaped socket that extends at a corner of the base from the rear wall of the support to a front end of the support, said rear wall having an opening providing an entry from the socket into the cavity, said support having an open front end, an open rear end and a passageway extending between the open front end and the open rear end, a printed circuit board positioned in the passageway by the housing, a magnet coil winding positioned in the cavity, said magnet coil winding having a bore axially aligned with the center of the opening and its energization controlled by a circuit on the printed circuit board, a switch module positioned in the socket, said module including: a housing having a first pair of mutually perpendicular side walls engaging the mutually perpendicular walls of the socket and second pair of mutually perpendicular walls aligned with a pair of mutually perpendicular walls of the base, a rear end engaging the rear wall of the support, a front end aligned with the front end of the support, and a hollow projection extending from the rear end of the module through the opening into the bore of the magnet coil, a pair of terminals on the front end of the module, a solid state circuit including a bistable state solid state switching device positioned within the cavity and connected to the terminals for completing a circuit between the terminals when device is conductive and interrupting the circuit when the device is nonconductive and a reed switch positioned within the projection, said reed switch having contacts connected in the solid state circuit controlled by magnetic flux of the magnet coil winding for causing the switching device to be in one of its bistable states when the magnet coil is energized and in a second of its bistable states when the magnet coil is deenergized, and a cover positioned on the front end of the support, said cover having portions closing the open front end of the housing and a portion engaging the front end of the module maintaining the module in the socket.

2. The solid state relay as recited in claim 1 wherein the support is provided by two identical molded parts and the printed circuit board is positioned between the parts and includes a portion extending in the cavity.

3. The solid state relay as recited in claim 1 wherein the side walls of the support and a pair of ribs provide the support with a rectangularly shaped open sided socket at each of the four corners of the support and the relay includes four switching modules each maintained in one of the sockets by portions of the cover.

4. The solid state relay as recited in claim 1 wherein the switching module includes a selector switch mounted at the front end of the module and connected in circuit with the reed relay and the solid state circuit within the module for causing the switching device to selectively provide a normally open and a normally closed type switching contact function.

5. The solid state relay as recited in claim 1 wherein a portion of the switch module housing is provided by an extruded metal part and the solid state switching device is mounted on the metal part whereby the metal part acts as a heat sink for the switching device.

6. The solid state relay as recited in claim 1 wherein the printed circuit board includes a circuit which provides a timing function and a light emitting diode mounted on a portion of the board to be visible through an opening in the cover when the circuit is providing the timing function.

7. The solid state relay as recited in claim 6 including an adjustable potentiometer type resistor mounted on the cover to have its adjustment knob externally accessible and its terminals connected to the printed circuit for adjusting the duration of the timing function.

8. The solid state relay as recited in claim 2 wherein the printed circuit board provides a support for wire connecting terminals and the two molded parts are provided with slots which receive portions of the terminals.

9. The solid state relay as recited in claim 2 wherein the circuit on the printed circuit board includes a dropping resistor and the resistor is mounted on the portion of the board extending into the cavity in heat conducting relation with a rear wall of the base.

10. The solid state relay as recited in claim 3 wherein each of the four switching modules has its reed switch controlled by an individual magnet coil winding and the circuit on the printed circuit board is arranged so the magnet coils in the cavity are energized to cause two of the modules to provide an instantaneous type switching contact type of operation and two of the modules provide a timed switching type contact operation.

11. The solid state relay as recited in claim 1 wherein the coil winding is wound on a molded bobbin and the bobbin has a flange on one end that is received in a slot in the rear end of the support and a bore which receives the projection on the switching module.

* * * * *